US007663047B2

(12) United States Patent
Hanuschak

(10) Patent No.: US 7,663,047 B2
(45) Date of Patent: Feb. 16, 2010

(54) SYSTEM FOR GENERATING MUSICAL SOUNDS WITHIN A VEHICLE

(76) Inventor: Gregor Z. Hanuschak, 149 Whitemarsh Rd., Ardmore, PA (US) 19003

( * ) Notice: Subject to any disclaimer, the term of this patent is extended or adjusted under 35 U.S.C. 154(b) by 0 days.

(21) Appl. No.: 11/938,519

(22) Filed: Nov. 12, 2007

(65) Prior Publication Data

US 2008/0115654 A1 May 22, 2008

Related U.S. Application Data

(60) Provisional application No. 60/866,424, filed on Nov. 19, 2006.

(51) Int. Cl.
*G10H 7/00* (2006.01)
*G11C 1/00* (2006.01)

(52) U.S. Cl. .......................................... 84/602; 463/37

(58) Field of Classification Search .................. 463/37; 84/602

See application file for complete search history.

(56) References Cited

U.S. PATENT DOCUMENTS

| | | | | | |
|---|---|---|---|---|---|
| 4,995,294 | A | * | 2/1991 | Kashio et al. | 84/738 |
| 5,062,341 | A | * | 11/1991 | Reiling et al. | 84/702 |
| 5,192,823 | A | * | 3/1993 | Suzuki et al. | 84/600 |
| 5,557,683 | A | * | 9/1996 | Eubanks | 381/86 |
| 5,885,085 | A | * | 3/1999 | Fujita | 434/307 A |
| RE36,387 | E | * | 11/1999 | Rosenberg et al. | 702/139 |
| 6,838,610 | B2 | * | 1/2005 | de Moraes | 84/730 |
| 2003/0079600 | A1 | * | 5/2003 | de Moraes | 84/735 |
| 2005/0188821 | A1 | * | 9/2005 | Yamashita et al. | 84/611 |
| 2006/0052167 | A1 | * | 3/2006 | Boddicker et al. | 463/37 |
| 2007/0234888 | A1 | * | 10/2007 | Rotolo de Moraes | 84/730 |

* cited by examiner

*Primary Examiner*—Jeffrey Donels
(74) *Attorney, Agent, or Firm*—Choate, Hall & Stewart LLP; Sam Pasternack; John D. Lanza

(57) ABSTRACT

System for generating musical sounds. Structure adapted for mounting within a vehicle includes a plurality of spatially separated, touch-sensitive sensors for activation by an occupant of the vehicle. A memory module stores a plurality of musical sounds and a microcontroller is interconnected with the plurality of touch-sensitive sensors and the memory module to generate a signal including one or more of the stored musical sounds. A transmitter interconnected with the microcontroller transmits the one or more musical sounds to the vehicle's sound system. In a preferred embodiment, the musical sounds are drum sounds.

20 Claims, 2 Drawing Sheets

SYSTEM FOR GENERATING MUSICAL SOUNDS WITHIN A VEHICLE

This application claims priority to provisional patent application Ser. No. 60/866,424 filed on Nov. 19, 2006, the contents of which are incorporated herein by reference.

BACKGROUND OF THE INVENTION

This invention relates to a system allowing the occupant of a vehicle to generate musical sounds.

Automobile drivers are known to tap the steering wheel to simulate drum sounds, oftentimes accompanying music playing on the vehicle's audio system. Such tapping not only enhances the driver's musical experience hut also relieves boredom while driving. In addition to enhancing the driver's musical experience, such tapping will help keep drivers alert thereby making them less prone to accidents.

However, merely tapping a steering wheel does not produce genuine musical sounds. It is therefore an object of the present invention to provide a system that allows a vehicle occupant to tap on an array of sensors to generate true musical sounds such as, for example, the sounds made by the individual instruments within a standard drum kit that might include a base drum, snare, tom, high-hat, ride cymbal, crash cymbal, splash cymbal and cowbell. Such a system will be much more effective than merely tapping the steering wheel to ward off "highway hypnosis" or even falling asleep.

SUMMARY OF THE INVENTION

In one aspect, the invention is a system for generating musical sounds including structure adapted for mounting within a vehicle including a plurality of spatially separated, touch-sensitive sensors for activation by an occupant of the vehicle. A memory module stores a plurality of musical sounds and a microcontroller is interconnected with the plurality of touch-sensitive sensors and the memory module to generate a signal including one or more of the stored musical sounds. A transmitter interconnected with the microcontroller transmits the one or more musical sounds to the vehicle's sound system.

In a preferred embodiment, the structure is adapted for attachment to the steering wheel. The structure may be a cover fitting over the steering wheel. In this embodiment, the spatially separated, touch-sensitive sensors form a substantially circular array on the steering wheel cover. The memory module preferably stores drum sounds but those skilled in the art will recognize that other musical sounds may be included. In a preferred embodiment, there are eight touch-sensitive sensors for producing eight different sounds.

In this embodiment the sensors may be piezoelectric sensors and preferred memory is flash memory stored in a compact flash memory card.

In yet another embodiment, the system further includes a radio receiver whose output may be mixed with the one or more stored musical sounds and an auxiliary input may be provided for mixing other audio inputs with the one or more musical sounds. For example, the auxiliary input may receive signals from an MP3 player, an I-Pod, a CD or an audio cassette player. In still another embodiment, an accelerometer is provided to determine when the vehicle is moving to prevent system use if desired. It is also contemplated that the system may include Bluetooth interconnectivity for communication with systems in other vehicles.

DESCRIPTION OF THE PREFERRED EMBODIMENT

Figure 1:
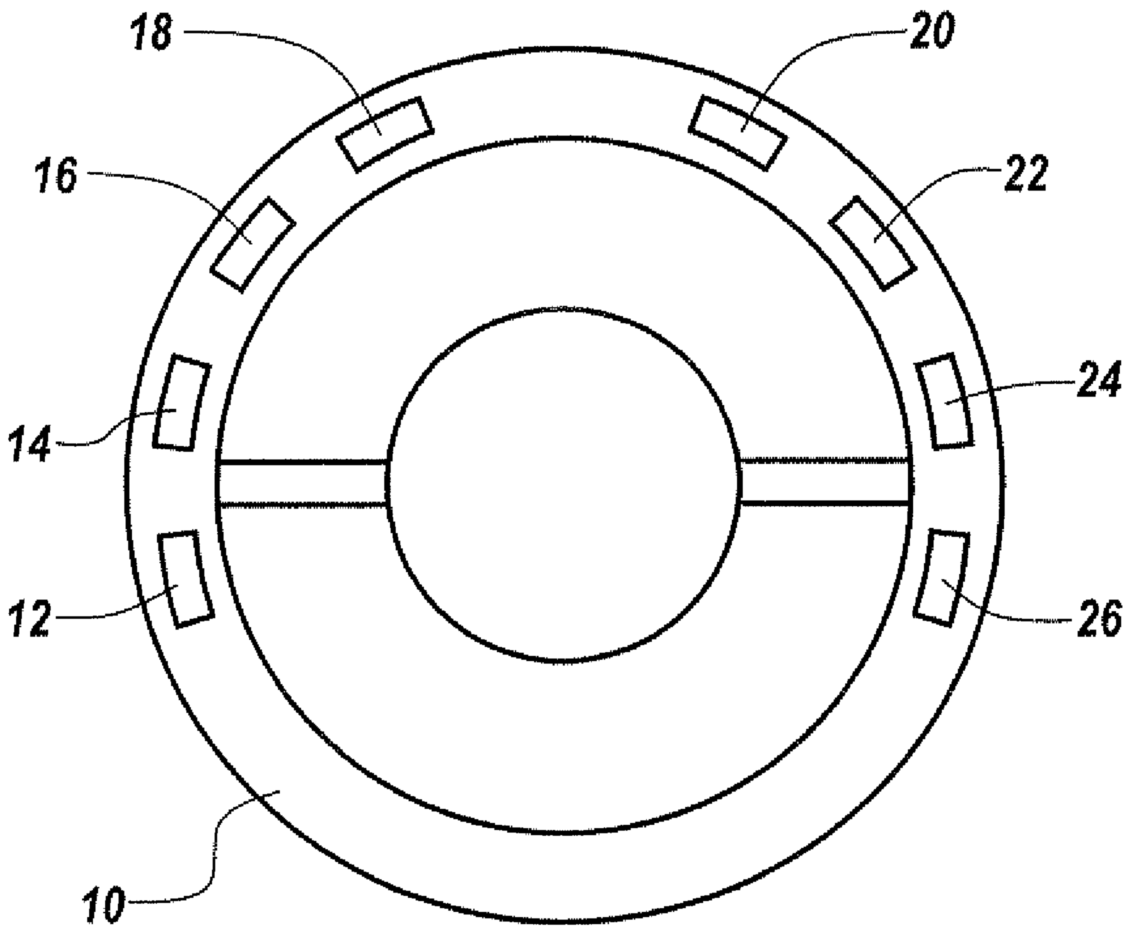
FIG. 1 is a schematic illustration of a steering wheel cover for use with the system of the invention.

With reference to FIG. 1, a steering wheel cover 10 includes a plurality of spatially separated, touch-sensitive sensors 12-26. The eight sensors illustrated in FIG. 1 are merely representative. Fewer than or more than eight sensors are contemplated in the present invention. As will be described in detail below, applying pressure to one or more of the sensors 12-26 will generate sounds such as, for example, sounds from a standard drum kit. The sounds may represent any desired musical instrument such as guitars or keyboards. A preferred sensor 12-26 is a piezoelectric film sensor such as a Digi-Key Part No. MSP1006-ND. Such piezoelectric sensors generate a voltage when pressure is applied to the sensor. Those skilled in the art will appreciate that any suitable sensor or switch may be used to select the sounds stored in the memory.

Figure 2:
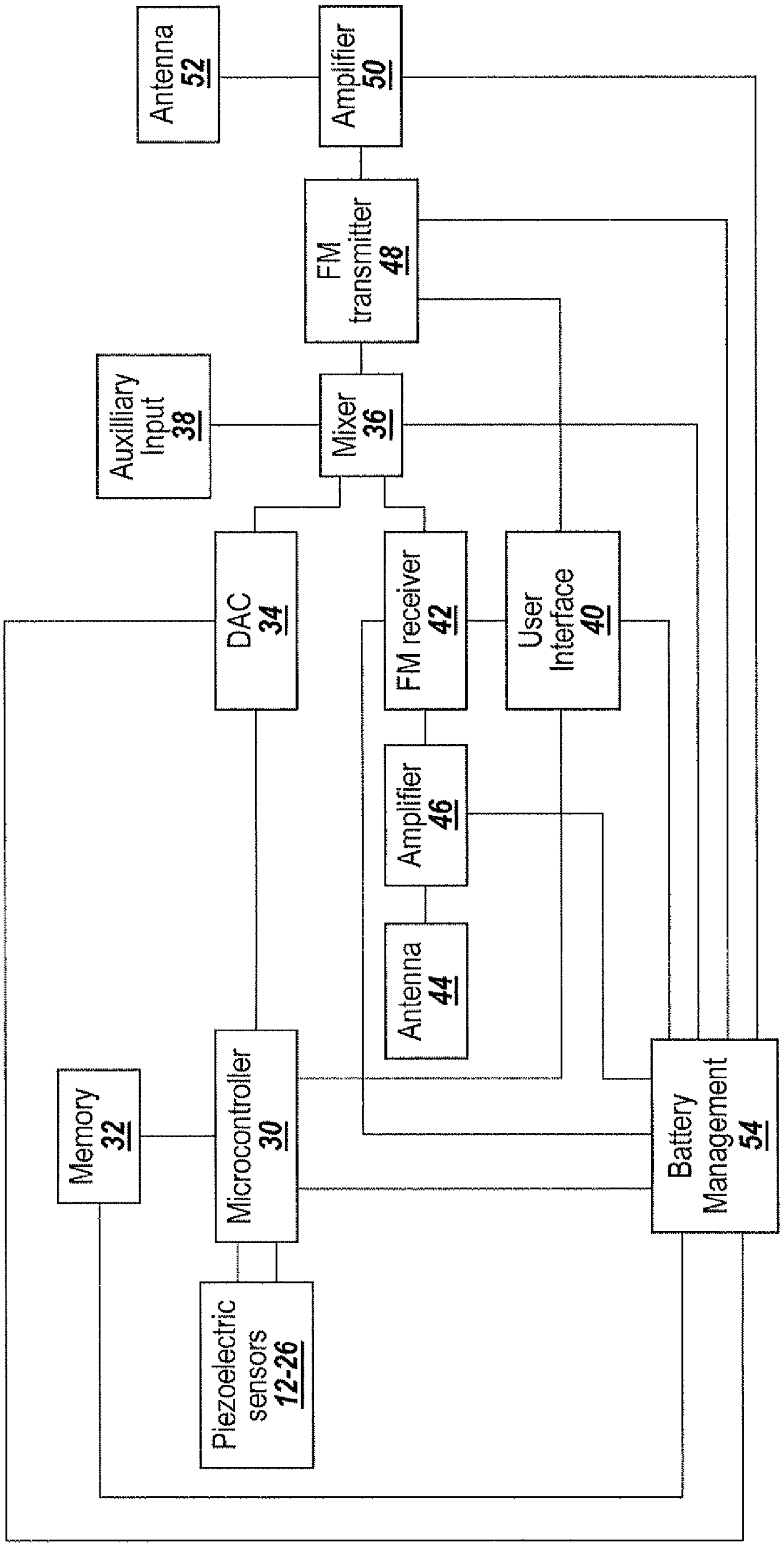
FIG. 2 is a schematic block diagram of an embodiment of the invention.

The system disclosed herein will now be described in detail with reference to FIG. 2. The piezoelectric sensors 12-26 generate a low-level voltage when pressure is applied. This voltage is amplified and low pass filtered and fed to a microcontroller 30. Those skilled in the art will recognize that the microcontroller 30 is any suitable microcontroller such as a microcontroller unit such as a programmable intelligent computer (PIC). A digital signal processor (DSP) or a field-programmable gate array (FPGA) may be used in place of a microcontroller. A memory module 32 stores a plurality of musical sounds such as the sounds from a standard drum kit. As stated earlier, the memory may be flash memory stored in a compact flash memory card. Other types of memory may be used including programmable read-only memory (PROM), erasable PROM (EPROM), and electronically erasable PROM (EEPROM), or an electrically alterable read-only memory (EAROM). One or more of the musical sounds is output to a digital-to-analog converter 34 that sends a signal to a mixer 36. An auxiliary input 38 may also be provided. The system disclosed herein is under the control of a user interface 40 that may be a graphical user interface.

In order to mix sounds from the memory 32 with other musical material, the system of the invention may include a radio receiver 42, preferably an FM radio receiver, that receives broadcast material through an antenna 44 that is then amplified by an amplifier 46. The system of the invention also includes an FM transmitter 48, an amplifier 50 and an antenna 52 for transmitting information to a vehicle's standard radio receiver (not shown). A battery management module 54 provides electrical power for the system.

The operation of the system disclosed herein will now be described. The vehicle driver affixes the steering wheel cover 10 to the steering wheel and turns on the system. The FM transmitter 48 which is a low power transmitter complying with applicable FCC regulations is tuned to a dead air spot on the FM dial. The vehicle's audio system radio is also tuned to the same dead air frequency for receiving signals from the FM transmitter 48.

When the driver applies pressure to one of the sensors 12-26, a signal from the memory 32 passes through the digital-to-analog converter 34 and is transmitted by the transmitter 48 to the vehicle's sound system. When the memory 32 stores drum sounds, applying pressure to the sensors 12-26 will then play drum sounds through the vehicle's existing audio system.

If desired, the sounds from the memory 32 may be mixed with sounds from an FM receiver 42 tuned to any selected station. The receiver 42 is part of the system of the invention and is separate from the receiver that forms part of the vehicle's audio system. The output of the receiver 42 is mixed in a mixer 36 so that both content from the memory 32 and from the receiver 42 can be heard through the vehicle's sound system. Yet additional audio content may be provided through auxiliary input 38. The user interface 40 is used to tune the receiver 42 and the FM transmitter 48 and to operate the microcontroller 30 to control the system.

Thus, the system disclosed herein may be used to generate sounds, such as drum sounds, stored in memory. Such sounds may also be combined with other audio input to provide, for example, drum sounds where there had been none or to enhance drum sounds included in the audio content from the receiver 42 or the auxiliary input 38.

While the embodiment shown in FIG. 1 is tailored specifically for use in conjunction with the steering wheel, it is contemplated that the array of sensors may be mounted for use by any vehicle occupant in the front or back seat. For example, the array of sensors could be mounted on a seat back to be activated by a rear seat passenger such as a child. It is also contemplated that individual users can personalize the system by choosing which sounds they wish to be available for their drumming pleasure. The sensors can also be configured for setting loop points so that a sequence of, for example, drum sounds can be repeated.

Bluetooth connectivity may be provided so that a system of the invention installed in one vehicle could communicate with another system in another vehicle nearby as might be the case during traffic jams. In this way, two or more vehicles can share audio content.

It is recognized that modifications and variations of the invention disclosed herein will be apparent to those of ordinary skill in the art and it is intended that all such modifications and variations be included within the scope of the appended claims.

What is claimed is:

1. System for generating musical sounds comprising:

structure adapted for mounting within a vehicle to one of: a steering wheel and a car seat, the mounting structure including a plurality of spatially separated, touch-sensitive sensors for activation by an occupant of the vehicle;

a memory module, in the mounting structure, storing one or more musical sounds;

a microcontroller, in the mounting structure, interfacing with the plurality of touch-sensitive sensors and the memory module to generate a signal representing one or more of the stored musical sounds;

a user interface, in the mounting structure and in communication with the microcontroller, configured for downloading the one or more stored musical sounds from an available selection of musical sounds, the one or more stored musical sounds customizable by the microcontroller to relate a different musical sound to each of the plurality of touch sensitive sensors; and a transmitter, in the mounting structure, interconnected with the microcontroller for transmitting the generated signal to the vehicle's sound system.

2. The system of claim 1 wherein the mounting structure further comprises means for attachment to the steering wheel or car seat of the vehicle.

3. The system of claim 2 wherein the mounting structure is a cover for attachment to the steering wheel or car seat of the vehicle.

4. The system of claim 3 wherein the spatially separated, touch-sensitive sensors are arranged within a substantially circular array.

5. The system of claim 1 wherein the generated signal is a Frequency Modulation (FM) signal.

6. The system of claim 1 wherein one or more of the touch-sensitive sensors are configured for setting loop points for repeating a sequence of musical sounds.

7. The system of claim 6 wherein the sequence of musical sounds comprises drum sounds.

8. The system of claim 1 wherein the sensors are piezoelectric sensors.

9. The system of claim 1 wherein the memory is selected from the group consisting of flash memory, programmable read-only memory, erasable PROM, electronically erasable PROM, and electronically alterable read-only memory.

10. The system of claim 1 further including a radio receiver whose output is mixed with the one or more stored musical sounds.

11. The system of claim 1 further including an auxiliary input, in communication with the microcontroller, for mixing with the one or more stored musical sounds.

12. The system of claim 1 wherein the one or more stored musical sounds represent musical sounds from at least one of: a drum, guitar, bass, keyboard, other musical instruments and non-musical sounds.

13. The system of claim 12 wherein the one or more stored musical sounds comprises sounds from a bass drum, snare, tom drum, high-hat, ride cymbal, crash cymbal, splash cymbal or cowbell.

14. The system of claim 11 wherein the auxiliary input is adapted to receive signals from MP3 players, CDs or audio cassette players.

15. The system of claim 1 further including an accelerometer, in communication with the microcontroller, to determine when the vehicle is moving to prevent system use.

16. The system of claim 9 wherein the flash memory is a compact flash memory card.

17. The system of claim 1 further including Bluetooth interconnectivity, provided by the microcontroller, for communications with systems in other vehicles to share audio content.

18. The system of claim 1 wherein the microcontroller is selected from the group consisting of a programmable intelligent computer, a digital signal processor and a field-programmable gate array.

19. The system of claim 1 wherein a digital signal processor or a field-programmable gate array is used in place of a microcontroller.

20. The system of claim 1 wherein the user interface is configured to allow a user to select a musical sound for each of the plurality of touch-sensitive sensors from the one or more stored musical sounds.

* * * * *